United States Patent [19]

Haussmann et al.

[11] Patent Number: 5,097,203
[45] Date of Patent: Mar. 17, 1992

[54] METHOD AND CIRCUIT FOR PRODUCING AN INPUT VARIABLE FOR A CROSS-COIL INDICATING DEVICE

[75] Inventors: Bernd Haussmann, Königstein; Robert Belz, Wiesbaden, both of Fed. Rep. of Germany

[73] Assignee: VDO Adolf Schindling AG, Frankfurt, Fed. Rep. of Germany

[21] Appl. No.: 573,571

[22] Filed: Aug. 24, 1990

[30] Foreign Application Priority Data

Aug. 24, 1989 [DE] Fed. Rep. of Germany ....... 3927966

[51] Int. Cl.$^5$ .................. G01R 15/10; G01R 1/20
[52] U.S. Cl. ................................ 324/131; 324/144; 324/167
[58] Field of Search ............... 324/120, 131, 115, 144, 324/167

[56] References Cited

U.S. PATENT DOCUMENTS

| | | | |
|---|---|---|---|
| 3,068,406 | 11/1962 | Dellinger | 324/131 |
| 4,841,238 | 6/1989 | Birch | 324/144 |

FOREIGN PATENT DOCUMENTS

| | | |
|---|---|---|
| 0031702 | 7/1981 | European Pat. Off. . |
| 0031703 | 7/1981 | European Pat. Off. . |
| 0218737 | 10/1985 | European Pat. Off. . |
| 2057693 | 4/1981 | Great Britain . |
| 3339231 | 5/1984 | Germany . |
| 3434189 | 3/1986 | Germany . |
| 8703978 | 7/1987 | Internat. Appl. . |

Primary Examiner—Ernest F. Karlsen
Attorney, Agent, or Firm—Martin A. Farber

[57] ABSTRACT

A method of producing an input variable for a cross-coil indicating instrument from a measurement signal is disclosed in which the frequency of the measurement signal is converted into a frequency-proportional input current for the cross-coil indicating instrument (11). Furthermore, a circuit is disclosed in which an input terminal for the measurement signal is connected to a period measuring device (3, 4, 5) the output of which is connected to a divider (6). The output of the divider feeds a control variable which is proportional to the frequency of the measurement signal ($f_M$) to an input (13) of a processing circuit (8, 10). The known method and the known circuit have the disadvantage that, in case of a low frequency of the measurement signal, a jerky movement of the pointer of the indicating instrument (11) can be observed. In order to eliminate this jerky movement, an input current which brings the cross-coil indicating instrument 11 to a predetermined value, independent of the actual frequency, is produced below a predetermined first frequency value of the measurement signal.

11 Claims, 1 Drawing Sheet

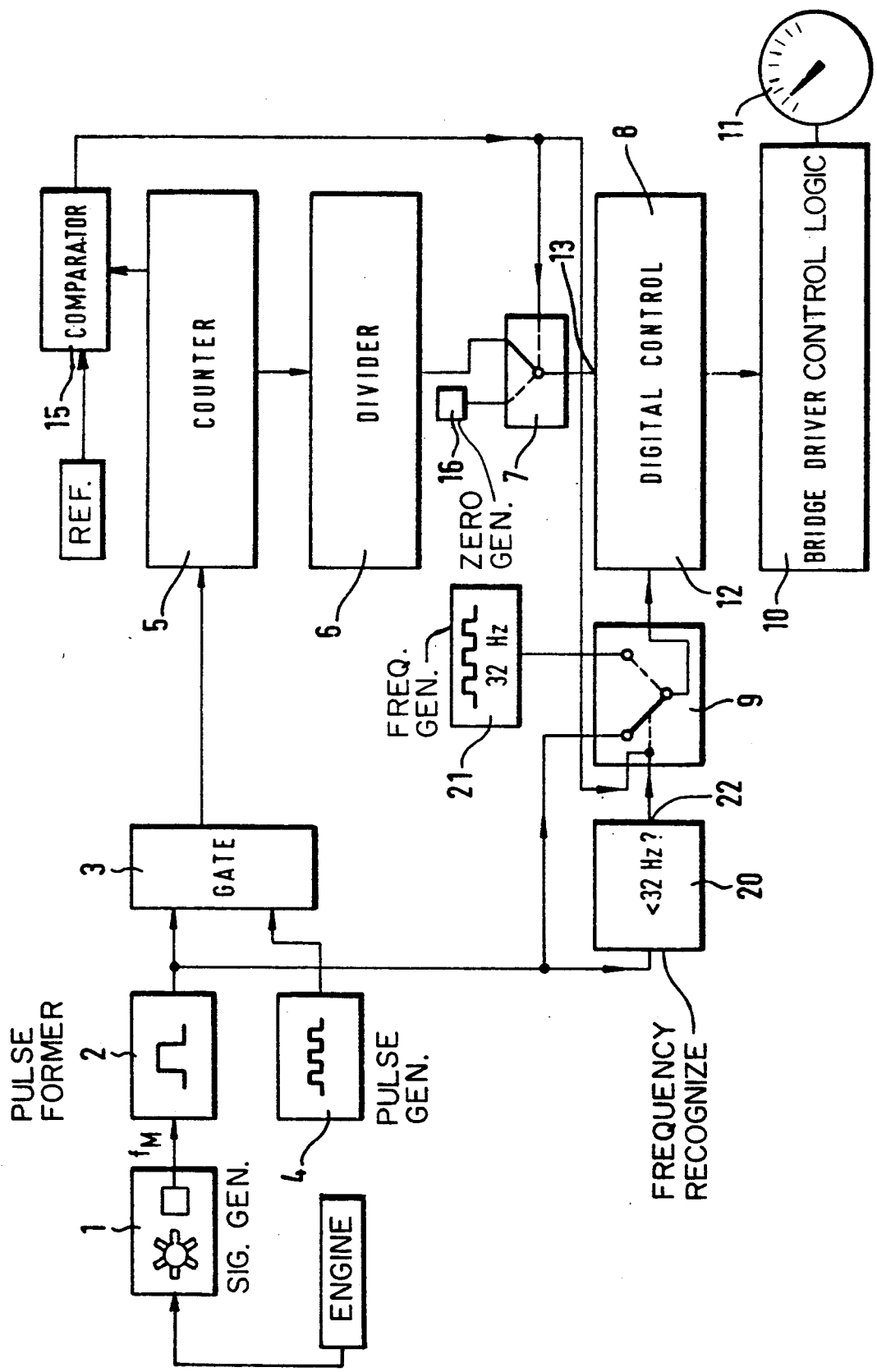

under the heading "METHOD AND CIRCUIT FOR PRODUCING AN INPUT VARIABLE FOR A CROSS-COIL INDICATING DEVICE":

METHOD AND CIRCUIT FOR PRODUCING AN INPUT VARIABLE FOR A CROSS-COIL INDICATING DEVICE

FIELD AND BACKGROUND OF THE INVENTION

The present invention relates to a method of producing an input variable for a cross-coil indicating instrument from a measurement signal, wherein the frequency of the measurement signal is converted into a frequency-proportional input current for the cross-coil indicating instrument.

The invention furthermore relates to a circuit for producing an input variable for a cross-coil indicating instrument having a measurement-signal input terminal which is connected to a period measuring device the output of which is connected to a dividing device. An output of the dividing device feeds a control variable, proportional to the frequency of the measurement signal, to an input of a processing circuit.

Such a method and circuit are known from European Patent EP 218 737 B. The period of an input signal having a frequency is determined and converted into a 10-bit digital word by formation of the reciprocal of the frequency. A processing circuit having a digital control device which operates in the known case in accordance with a $PT_2$-algorithm serves to compensate for variations in the frequency of the input signal. The result of the control is converted into a suitable input current for the cross-coil indicating instrument. "Input current" is a collective term for the distribution of the currents fed to the individual coils of the cross-coil indicating instrument.

Cross-coil indicating instruments are preferably used also for the indicating of non-electric variables, for instance for indicating engine rpms or speeds in a vehicle. The variables produced upon such measurements cover a relatively large frequency range so that a period measurement and an input-synchronous processing are usually required. Due to the input-synchronous processing, unsatisfactory indicating behavior results in case of low frequencies of the measurement signal. The pointer then changes its position in jerkwise fashion from time to time which is found unpleasant by an observer.

SUMMARY OF THE INVENTION

It is an object of the present invention to provide a method and circuit which make it possible to produce an input variable for a cross-coil indicating instrument which results in more pleasant indicating behavior.

According to the invention, below a predetermined first frequency value of the measurement signal, there is produced an input current controlling the cross-coil indicating instrument at a predetermined value independent of the actual frequency.

This method is particularly advantageous when the cross-coil indicating instrument is used for indicating the speed of rotation of an engine. Internal combustion engines must have a certain minimum speed. Satisfactory idling behavior cannot be achieved below said speed. For this reason, the cross-coil indicating instrument can indicate a value of zero when the frequency of the measurement signal is below a predetermined first frequency value which is, for instance, below the normal idling speed of the engine in question. However, also in other areas, it is more important for the driver of a vehicle to be given an indication which is easy to observe rather than to be given an exact value of the variable to be indicated. It is, as a rule, of no interest, for instance, whether the vehicle is moving at a speed of 7 km/hr or 11 km/hr. At these speeds, the driver usually does not refer to the indication of the speedometer. For this reason, even many of the traditional speed indicating instruments are no longer provided with a true zero-position. The stop for the indicating needle is frequently located already at the "20 km/hr" position.

When using a cross-coil indicating instrument as indicator for the speed of the vehicle, the following problem occurs: When the vehicle is moving at very slow speed, the measurement signal also has only a very low frequency which, however, is greater than the first frequency value. The indication which is produced by the cross-coil indicating instrument is now updated by this frequency. The jumps in the indicator which occur thereby are still felt to be unpleasant. In order to make the movement of the pointer of the of the cross-coil indicating instrument more continuous, it is therefore proposed, in one preferred embodiment of the invention that below a predetermined second frequency value of the measurement signal which is greater than the first frequency value, the change in the input current take place with a predetermined constant frequency, the maximum rate of change of the input current being limited. In other words, the change in position of the pointer of the cross-coil indicating instrument is effected with a higher frequency than the frequency of the input signal. It is seen to it in this connection that the pointer does not move suddenly over a large range and then remain stationary again over several pulses. The larger movement is excluded by limiting the rate of the change to a maximum value. The jerky movement of the pointer is thereby divided into numerous small individual steps which can no longer be perceived by the eye. The movement of the pointer is perceived as continuous.

In a process in which the input current is controlled digitally as a function of the measurement signal, it is advantageous for the control above the predetermined second frequency value to be clocked with the frequency of the measurement signal, and for the control below the predetermined second frequency value to be clocked with the constant clock frequency. By the control, the maximum rate of change is limited. The control takes place in this case in input-synchronous manner at higher speeds, but at lower speeds the control operates as a function of the constant clock frequency. Thus, assurance is had that at low speeds the indicating range can be traversed more or less continuously, which is found by the observer to be pleasant.

The predetermined second frequency value is advantageously equal to the value of the predetermined constant clock frequency. It is made possible in this way for a transition between a change of the pointer position of the cross-coil indicating instrument with the frequency of the measurement signal, and the change in position of the pointer with the clock frequency to take place continuously. The change is therefore practically imperceptible to the driver of the vehicle. In addition, the clock frequency can also be used as a standard of comparison in order to determine whether the frequency of the input signal exceeds or is below the predetermined second frequency value. No additional frequency-generating device is required.

In a preferred embodiment, the predetermined second frequency value is greater than 25 Hz and, in particular equal to 32 Hz. As is known, the human eye no longer detects discrete processes from a certain frequency on, so that the impression of a continuous movement is subjectively created. In an indicating instrument, this is the case at frequencies above 25 Hz, and in particular at 32 Hz.

According to the invention, the processing circuit (8, 10) is clocked with the frequency ($f_M$) of the measurement signal and the period measuring device (3, 4, 5) is connected to a first comparator (15) which produces a signal when the period exceeds a predetermined length, this signal switching the signal input (13) of the processing circuit (8, 10) to a predetermined value (16). At low input frequencies, long periods result. Long periods, in turn, require measurement devices which are designed for such periods. Such measurement devices are complicated and expensive. The exceeding of a predetermined period can, on the other hand, easily be determined. If the predetermined period is exceeded, it is clear that the frequency of the measurement signal has dropped below a predetermined value. In this case, as mentioned at the beginning, the indication of the cross-coil indicating instrument should be brought to a predetermined value, for example, the value of zero, which is possible, for instance, when the processing circuit is given a corresponding input value.

The first comparator (15) advantageously has a counter which produces the signal when a certain count of the counter is reached. It is advantageous to equip the period measuring device with a counter which counts the pulses which are produced by a pulse generator during the period or a part thereof.

In one preferred embodiment, the control value is a digital numerical value which is set to zero by the first comparator (15) if the period exceeds the predetermined duration. Digital numerical values can easily be processed and can be set to zero very precisely.

A frequency recognition circuit (20) operates in the manner of a second comparator and is advantageously provided to compare the frequency ($f_M$) of the measurement signal with a predetermined reference frequency and, when the frequency ($f_M$) drops below the reference frequency, the recognition circuit (20) brings the clock frequency with which the processing circuit (8, 10) is clocked to a constant value. The clock frequency which is responsible for the speed at which the processing circuit operates and thus for the speed at which the processing circuit changes its output is therefore changed as a function of the frequency of the measurement signal.

In one advantageous embodiment there is provided a changeover switch (9) the control input of which is connected to the recognition circuit (20), whose output is connected to the clock input (12) of the processing circuit (8, 10). One input of the switch (9) is connected to the input terminal for the measurement signal, and the other input of the switch (9) to a frequency generator (21). The changeover switch therefore either switches the measurement signal to the clock input of the processing circuit or an output signal of the frequency generator.

BRIEF DESCRIPTION OF THE DRAWING

With the above and other advantages in view, the present invention will become more clearly understood in connection with the detailed description of the preferred embodiment, when considered with the accompanying drawing in which the sole FIGURE shows a circuit of the invention.

DETAILED DESCRIPTION OF THE PREFERRED EMBODIMENT

A signal generator 1 produces at its output a signal $f_M$ as a function of a variable to be measured, for instance the rpm of an engine or the speed of a vehicle. The production of the signal can, in this connection, be effected in known manner by an inductive or optical generator which produces a train of pulses as a function of the rpm to be measured or the speed to be measured. The pulse train of the frequency $f_M$ is formed in a pulse former 2 and fed to an input of a gate circuit 3. The other input of the gate circuit 3 is connected to an output of a counter frequency generator 4. The output of the gate circuit 3 is connected to an input of a counter 5. As long as the output of the pulse former 2 is, for instance, at a level of logical 1, then the gate circuit 3 is opened for the pulses of the counter frequency generator 4 so that the counter 5 can count the number of pulses of the counter frequency generator 4 which pass the gate circuit 3 during this time interval. As a result of the number determined by the counter 5, a determination can be made as to the duration of the period of the signal of the signal generator 1.

The output fo the counter 5 is connected to an input of a divider 6 which forms the reciprocal of the period of the aforementioned time interval, and thus determines the frequency of the signal of the signal generator 1. At the output of the divider 6 there appears a digital number which is proportional to the frequency $f_M$ of the signal of the signal generator 1 and which is conducted further via a first changeover switch 7 to a signal input 13 of a digital control 8. A clock input 12 of the digital control 8 is connected via a second changeover switch 9 to the output of the pulse former 2 so that the digital control 8 is clocked in the normal case with the frequency $f_M$ of the signal of the signal generator 1.

At the output of the digital control 8, a digital number appears, which is fed to an input of a control logic 10, which, as a function of that number, produces currents for the coils of a cross-coil indicating instrument 11, i.e. an input current. The counter 5 is connected to a comparator circuit 15 which monitors whether the period exceeds a predetermined duration, provided by the comparator reference, or not. The output of the comparator circuit 15 is connected to a control input of the first changeover switch 7. If the comparator circuit 15 determines that a predetermined length of period has been exceeded, it switches the first changeover switch 7, which then connects a "zero" generator 16 to the signal input 13 of the digital control 8. At the signal input 13, there is now no longer present the digital number produced at the output of the divider 6, but the number zero. The digital control forwards this number zero to the control logic 10 with a delay time which depends on the control characteristics. The control logic 10 thereupon produces input currents for the cross-coil indicating instrument which move the pointer of the cross-coil indicating instrument to a predetermined position, for instance to the indication value zero.

As mentioned above, the output of the pulse former 2 is connected to an input of the second changeover switch 9. The output of the pulse former 2 is further connected to a 32 Hz-recognition circuit 20 which may include a reference clock (not shown) operative at 32

Hz to serve as a basis for determining the pulse-repetition frequency of the pulse train signal outputted by the pulse former 2. The output signal of the recognition circuit 20 changes depending on whether the frequency $f_M$ of the signal of the signal generator 1 exceeds the value of 32 Hz or not. If the frequency $f_M$ is greater than 32 Hz, the output signal of the 32 Hz recognition circuit 20 switches the second changeover switch 9 into the position shown in solid line, i.e. the frequency $f_M$ is fed to the clock input 12 of the digital control 8. However, if the frequency $f_M$ drops below 32 Hz, the changeover switch 9 is switched and connects the clock input 12 of the digital control 8 to an output of a 32 Hz-generator 21. The digital control 8 is then no longer clocked with the frequency $f_M$ of the signal of the signal generator 1 but with the 32 Hz frequency of the 32 Hz generator 21.

In a manner of operation in which the frequency $f_M$ of the signal of the signal generator 1 is greater than 32 Hz, the counter 5 determines the duration of the period, which, by means of the divider 6, is again converted into a number which is proportional to the frequency $f_M$. In order not to have sudden changes in this number reflected on the indicating instrument 11, the digital control delays the changes, preferably by a $PT_2$-behavior. The digital control is, in this case, clocked with the frequency $f_M$ of the signal of the signal generator 1, i.e. after each period of this signal an updating of the pointer position of the indicating instrument 11 takes place. As a result of the $PT_2$-control, the rate of change of the pointer position is limited. If the frequency $f_M$ now drops below 32 Hz, an updating of the pointer position would only take place at relatively large intervals, which is perceived as an unpleasant vibrating or fluctuating of the pointer by the driver of a vehicle who looks at the indicating instrument. At the moment when the frequency $f_M$ drops below 32 Hz, the digital control is therefore no longer clocked with the frequency $f_M$, but in a constant manner with 32 Hz. At the same time, the digital control 8 limits the maximum change which the pointer can carry out between two positions during one period. To be sure, this has the disadvantage that the pointer of the indicating instrument 11 follows the true measured value only with a certain lag, but the observer nevertheless finds it more pleasant to observe a pointer which moves continuously and not in jerks.

Such a manner of operation occurs, for instance, when the circuit arrangement described is used in a E-speedometer, i.e. in a speed indicator which, by means of the cross-coil indicating instrument 11, indicates the speed determined via the signal generator 1. Below a first speed, for instance 25 km/hr, the pointer position is updated with 32 Hz. Below a second speed, for instance 10 km/hr, the pointer will constantly show a value of zero.

We claim:

1. A method of producing an input variable for a cross-coil indicating instrument from a measurement signal, comprising the steps of
   converting a frequency of the measurement signal into a frequency-proportional input current for the cross-coil indicating instrument; and
   below a predetermined first frequency value of the measurement signal, producing an input current controlling the cross-coil indicating instrument at a predetermined value independent of an actual frequency of the measurement signal; and
   below a predetermined second frequency value of the measurement signal, which is greater than said first frequency value, performing a change in the input current at a predetermined constant frequency; and
   limiting a maximum rate of change of the input current.

2. Method according to claim 1, wherein
   said step of producing the input current includes controlling digitally the input current as a function of the measurement signal;
   for control of the input current above said predetermined second frequency value, clocking the input current with the frequency of the measurement signal; and
   for control of input current below the predetermined second frequency value, clocking the input current with a constant clock frequency.

3. Method according to claim 1, wherein
   said step of producing the input current includes controlling digitally the input current as a function of the measurement signal;
   for control of the input current above said predetermined second frequency value, clocking the input current with the frequency of the measurement signal; and
   for control of input current below the predetermined second frequency value, clocking the input current with a constant clock frequency.

4. Method according to claim 1, wherein
   the predetermined second frequency value is equal to the value of the predetermined constant clock frequency.

5. Method according to claim 2, wherein
   the predetermined second frequency value is equal to the value of the predetermined constant clock frequency.

6. Method according to claim 1, wherein the predetermined second frequency value is greater than 25 Hz.

7. A system for producing an input variable for a cross-coil indicating instrument, the circuit comprising
   a period measuring device, a dividing device, a processing unit, a first comparator, and switching means, the circuit having a measurement-signal input terminal which is connected to said period measuring device; and
   wherein the output of the period measuring device is connected to said dividing device;
   an output of the dividing device feeds a control variable proportional to the frequency of the measurement signal to an input of said processing unit;
   the processing unit is clocked with the frequency of a measurement signal;
   said period measuring device is connected to said comparator;
   said comparator produces a signal when the period exceeds a predetermined length, the signal of said comparator activating said switching means for switching the input of said processing unit to a predetermined control value;
   said system further comprises second switching means, and frequency recognition means which compares the frequency of the measurement signal with a predetermined reference frequency; and
   upon a value of the reference frequency exceeding a value of the frequency of the measurement signal, the recognition means activates the second switching means to apply a clock frequency signal of constant frequency to said processing unit.

8. A system according to claim 7, wherein said period measuring device comprises a counter operatively coupled to said comparator; and wherein said comparator produces its signal when a predesignated count of the counter is reached.

9. A system according to claim 8, wherein the control value is a digital numerical value of zero selected by said comparator if the period exceeds the predetermined duration.

10. A system according to claim 7, wherein the control value is a digital numerical value of zero selected by said comparator if the period exceeds the predetermined duration.

11. A system according to claim 8, wherein said second switching means is a changeover switch having control input which is connected to an output of said recognition means; and one signal input of said changeover switch is connected to the input terminal for the measurement signal, and a second signal input of said changeover switch is connected to said clock frequency signal.

* * * * *